(12) United States Patent
McCune et al.

(10) Patent No.: US 6,864,668 B1
(45) Date of Patent: Mar. 8, 2005

(54) HIGH-EFFICIENCY AMPLIFIER OUTPUT LEVEL AND BURST CONTROL

(75) Inventors: Earl McCune, Santa Clara, CA (US); Wendell Sander, Los Gatos, CA (US)

(73) Assignee: Tropian, Inc., Cupertino, CA (US)

( * ) Notice: Subject to any disclaimer, the term of this patent is extended or adjusted under 35 U.S.C. 154(b) by 0 days.

(21) Appl. No.: 09/247,097

(22) Filed: Feb. 9, 1999

(51) Int. Cl.$^7$ .............................. G05F 1/40; H03G 3/20
(52) U.S. Cl. ...................................... 323/266; 330/129
(58) Field of Search ............................... 323/266, 268, 323/273, 303, 350, 351; 330/10, 297, 296, 285, 255, 129

(56) References Cited

U.S. PATENT DOCUMENTS

| | | | |
|---|---|---|---|
| 3,777,275 A | 12/1973 | Cox ............................ | 330/10 |
| 3,900,823 A | 8/1975 | Sokai et al. | |
| 3,919,656 A | 11/1975 | Sokal et al. ................... | 330/51 |
| 4,178,557 A | 12/1979 | Henry .......................... | 330/10 |
| 4,367,443 A * | 1/1983 | Hull et al. ................... | 330/298 |
| 4,392,245 A | 7/1983 | Mitama ....................... | 455/115 |
| 4,717,884 A | 1/1988 | Mitzlaff ...................... | 330/251 |
| 4,743,858 A | 5/1988 | Everard ........................ | 330/10 |

(List continued on next page.)

FOREIGN PATENT DOCUMENTS

| | | |
|---|---|---|
| FR | 2 768 574 A1 | 3/1999 |
| GB | 2 209 639 A | 5/1989 |

OTHER PUBLICATIONS

Nojima, T., Circuit technology for mobile/personal communications, 24th European Microwave Conf; Cannes, France; Sep. 1994; pp. 220–229.

*Primary Examiner*—Rajnikant B. Patel
(74) *Attorney, Agent, or Firm*—Thelen Reid & Priest LLP

(57) ABSTRACT

The present invention, generally speaking, provides for high-efficiency power control of a high-efficiency (e.g., hard-limiting or switch-mode) power amplifier. In one embodiment, the invention exploits the recognition that, for a constant-resistance circuit, power is equal to the square of the voltage across the circuit divided by the resistance of the circuit. In the case of certain switch mode amplifiers, such as Class E and Class F amplifiers, as well as saturated linear amplifiers, the amplifier may reasonably be regarded as having a constant resistance with varying power supply. In an exemplary embodiment, the supply voltage is controlled using a combination of two stages, a switch-mode converter stage that accomplishes gross power level control and a subsequent linear regulator stage that accomplishes more precise power envelope control, e.g., burst control. Control circuitry for the amplifier is simplified by combining control signals for power amplifier ramp-up transition, power level during a TDMA burst, and ramp-down transition, into a single control signal, and by eliminating feedback control (which also eliminates errors in the feedback control of output power due to the use of detecting diodes). Output noise from the variable output switch-mode voltage converter stage is filtered using the linear regulator stage that accomplishes burst control, further increasing circuit efficiency. Energy efficiency during ramp-up to the desired output power, during the burst at all output power levels, and during ramp-down from the transmitted power, is maximized. Reasonable expected efficiencies for the switch-mode converter stage and the linear regulator stage are 90% and 80%, respectively. A high-efficiency switch-mode amplifier may have an efficiency on the order of 80%, enabling an overall efficiency of greater than 50% to be achieved, comparing very favorably with current efficiencies of about 10%.

14 Claims, 2 Drawing Sheets

U.S. PATENT DOCUMENTS

| | | | |
|---|---|---|---|
| 4,804,931 A | 2/1989 | Hulick | 332/31 R |
| 4,831,334 A | 5/1989 | Hudspeth et al. | |
| 4,881,023 A * | 11/1989 | Perusse et al. | 323/266 |
| 4,896,372 A | 1/1990 | Weaver | 455/108 |
| 4,992,753 A | 2/1991 | Jenson et al. | 330/129 |
| 4,994,757 A * | 2/1991 | Bickley | 330/285 |
| 5,060,294 A * | 10/1991 | Schwent et al. | 455/93 |
| 5,095,542 A | 3/1992 | Suematsu et al. | 455/127 |
| 5,126,688 A | 6/1992 | Nakanishi et al. | 330/285 |
| 5,142,240 A | 8/1992 | Isota et al. | |
| 5,175,877 A | 12/1992 | Streeter | 455/102 |
| 5,182,527 A | 1/1993 | Nakanishi et al. | |
| 5,187,580 A | 2/1993 | Porter, Jr. et al. | 330/207 A |
| 5,193,223 A | 3/1993 | Walczak et al. | 455/115 |
| 5,247,264 A | 9/1993 | Cripe | 330/251 |
| 5,251,330 A | 10/1993 | Chiba et al. | |
| 5,268,658 A | 12/1993 | Edwards | 332/151 |
| 5,276,912 A | 1/1994 | Siwiak et al. | 455/73 |
| 5,329,249 A | 7/1994 | Cripps | 330/302 |
| 5,329,259 A | 7/1994 | Stengel et al. | 332/103 |
| 5,369,789 A | 11/1994 | Kosugi et al. | 455/126 |
| 5,410,272 A | 4/1995 | Haberland et al. | 330/129 |
| 5,420,536 A | 5/1995 | Faulkner et al. | |
| 5,430,416 A | 7/1995 | Black et al. | |
| 5,604,924 A | 2/1997 | Yokoya | 455/68 |
| 5,652,546 A | 7/1997 | Dent | 330/276 |
| 5,673,000 A * | 9/1997 | Strickland | 330/255 |
| 5,697,072 A | 12/1997 | Shibata | 455/115 |
| 5,697,074 A | 12/1997 | Makikallio et al. | 455/126 |
| 5,705,959 A | 1/1998 | O'Loughlin | |
| 5,745,526 A | 4/1998 | Kumm et al. | |
| 5,825,248 A | 10/1998 | Ozawa | |
| 5,831,475 A | 11/1998 | Myers et al. | |
| 5,847,602 A | 12/1998 | Su | |
| 5,861,777 A | 1/1999 | Sigmon et al. | |
| 5,880,633 A | 3/1999 | Leizerovich et al. | |
| 5,886,572 A | 3/1999 | Myers et al. | |
| 5,929,776 A | 7/1999 | Warble et al. | |
| 5,936,464 A | 8/1999 | Grondahl | |
| 5,942,938 A | 8/1999 | Myers et al. | |
| 5,990,735 A | 11/1999 | Sigmon et al. | |
| 6,002,923 A | 12/1999 | Sahlman | |
| 6,043,707 A | 3/2000 | Budnik | |
| 6,047,168 A | 4/2000 | Carlsson et al. | |
| 6,049,703 A | 4/2000 | Staudinger et al. | |
| 6,049,707 A | 4/2000 | Buer et al. | |
| 6,078,628 A | 6/2000 | Griffith et al. | |
| 6,084,468 A | 7/2000 | Sigmon et al. | |
| 6,100,756 A | 8/2000 | Wang et al. | |
| 6,101,224 A | 8/2000 | Lindoff et al. | |
| 6,107,880 A | 8/2000 | Shaw | |
| 6,130,910 A | 10/2000 | Anderson et al. | |
| 6,141,541 A | 10/2000 | Midya et al. | |

* cited by examiner

HIGH-EFFICIENCY AMPLIFIER OUTPUT LEVEL AND BURST CONTROL

BACKGROUND OF THE INVENTION

1. Field of the Invention

The present invention relates to amplifier output level control.

2. State of the Art

Battery life is a significant concern in wireless communications devices such as cellular telephones, pagers, wireless modems, etc. Radio-frequency transmission, especially, consumes considerable power. A contributing factor to such power consumption is inefficient power amplifier operation. A typical RF power amplifier for wireless communications operates with only about 10% efficiency. Clearly, a low-cost technique for significantly boosting amplifier efficiency would satisfy an acute need.

Furthermore, most modern digital wireless communications devices operate on a packet basis. That is, the transmitted information is sent in a series of one or more short bursts, where the transmitter is active only during the burst times and inactive at all other times. It is therefore also desirable that control of burst activation and deactivation be controlled in an energy-efficient manner, further contributing to extended battery life.

Power amplifiers are classified into different groups: Class A, Class B, Class AB, etc. The different classes of power amplifiers usually signify different biasing conditions. In designing an RF power amplifier, there is usually a trade-off between linearity and efficiency. The different classes of amplifier operation offer designers ways to balance these two parameters.

Generally speaking, power amplifiers are divided into two different categories, linear and non-linear. Linear amplifiers (e.g. Class A amplifiers and Class B push-pull amplifiers), maintain high linearity, resulting in faithful reproduction of the input signal at their output since the output signal is linearly proportional to the input signal. In non-linear amplifiers (e.g. single-ended Class B, and Class C amplifiers), the output signal is not directly proportional to the input signal. The resulting amplitude distortion on the output signal makes these amplifiers most applicable to signals without any amplitude modulation, which are also known as constant-envelope signals.

Amplifier output efficiency is defined as the ratio between the RF output power and the input (DC) power. A major source of power amplifier inefficiency is power dissipated in the transistor. A Class A amplifier is inefficient since current flows continuously through the device. Conventionally, efficiency is improved by trading-off linearity for increased efficiency. In Class B amplifiers, for example, biasing conditions are chosen such that the output signal is cut off during half of the cycle unless the opposing half is provided by a second transistor (push-pull). As a result, the waveform will be less linear. The output waveform may still be made sinusoidal using a tank circuit or other filter to filter out higher and lower frequency components.

Class C amplifiers conduct during less than 50% of the cycle, in order to further increase efficiency; i.e., if the output current conduction angle is less than 180 degrees, the amplifier is referred to as Class C. This mode of operation can have a greater efficiency than Class A or Class B, but it typically creates more distortion than Class A or Class B amplifiers. In the case of a Class C amplifier, there is still some change in output amplitude when the input amplitude is varied. This is because the Class C amplifier operates as a controlled current source—albeit one that is only on briefly—and not a switch.

The remaining classes of amplifiers vigorously attack the problem of power dissipation within the transistor, using the transistor merely as a switch. The underlying principle of this amplifier is that a switch ideally dissipates no power, for there is either zero voltage across it or zero current through it. Since the switch's V-I product is therefore always zero, there is no dissipation in this device. A Class E power amplifier uses a single transistor, in contrast with a Class D power amplifier, which uses two transistors.

In real life, however, switches are not ideal. (Switches have turn on/off time and on-resistance.) The associated dissipation degrades efficiency. The prior art has therefore sought for ways to modify so-called "switch-mode" amplifiers (in which the transistor is driven to act as a switch at the operating frequency to minimize the power dissipated while the transistor is conducting current) so that the switch voltage is zero for a non-zero interval of time about the instant of switching, thereby decreasing power dissipation. The Class E amplifier uses a reactive output network that provides enough degrees of freedom to shape the switch voltage to have both zero value and zero slope at switch turn-on, thus reducing switching losses. Class F amplifiers are still a further class of switch-mode amplifiers. Class F amplifiers generate a more square output waveform as compared to the usual sinewave. This "squaring-up" of the output waveform is achieved by encouraging the generation of odd-order harmonics (i.e., x3, x5, x7, etc.) and suppressing the even-order harmonics (i.e., x2, x4, etc.) in the output network.

An example of a known power amplifier for use in a cellular telephone is shown in FIG. 1. GSM cellular telephones, for example, must be capable of programming output power over a 30 dBm range. In addition, the transmitter turn-on and turn-off profiles must be accurately controlled to prevent spurious emissions. Power is controlled directly by the DSP (digital signal processor) of the cellular telephone, via a DAC (digital to analog converter). In the circuit of FIG. 1, a signal GCTL drives the gate of an external AGC amplifier that controls the RF level to the power amplifier. A portion of the output is fed back, via a directional coupler, for closed-loop operation. The amplifier in FIG. 1 is not a switch-mode amplifier. Rather, the amplifier is at best a Class AB amplifier driven into saturation, and hence demonstrates relatively poor efficiency.

SURVEY OF PRIOR PATENTS

Control of the output power from an amplifier is consistently shown as requiring a feedback structure, as exemplified in U.S. Pat. Nos. 4,392,245; 4,992,753; 5,095,542; 5,193,223; 5,369,789; 5,410,272; 5,697,072 and 5,697074. Other references, such as U.S. Pat. No. 5,276,912, teach the control of amplifier output power by changing the amplifier load circuit. U.S. Pat. No. 4,994,757 teaches that the power supply voltage can be varied to improve the efficiency of power amplifiers, but that further control of the actual amplifier output signal magnitude requires automatic control through a feedback process. U.S. Pat. No. 5,126,688 addresses the control of linear amplifiers using feedback control to set the actual amplifier output power combined with periodic adjustment of the power amplifier operating voltage to improve the operating efficiency of the power amplifier. U.S. Pat. No. 5,604,924 teaches a simplified control system for an analog cellular telephone. The operating voltage of a power amplifier operated in Class C is fed back and used to adjust the output power through operation of a variable voltage circuit implemented as a switch-mode DC-DC converter.

Despite the teachings of the foregoing references, a number of problems remain to be solved, including the following: simple control of amplifier output power, without the need for feedback or circuit configuration changes; allowing the amplifier to support bursted operation, such as in a time-division multiple access (TDMA) system; maintenance of high efficiency amplifier performance during power control changes, and high efficiency of DC to RF conversion from the original power supply through the amplifier, even during TDMA bursted operation; and elimination of incidental amplitude modulation of the power amplifier from ripple noise on the output of the switch-mode DC-DC converter.

SUMMARY OF THE INVENTION

The present invention, generally speaking, provides for high-efficiency power control of a high-efficiency (e.g., hard-limiting or switch-mode) power amplifier. In one embodiment, the invention exploits the recognition that, for a constant-resistance circuit, power is equal to the square of the voltage across the circuit divided by the resistance of the circuit. In the case of certain switch mode amplifiers, such as Class E and Class F amplifiers, as well as saturated linear amplifiers, the amplifier may reasonably be regarded as having a constant resistance with varying power supply. In an exemplary embodiment, the supply voltage is controlled using a combination of two stages, a switch-mode converter stage that accomplishes gross power level control and a subsequent linear regulator stage that accomplishes more precise power envelope control, e.g., burst control. Control circuitry for the amplifier is simplified by combining control signals for power amplifier ramp-up transition, power level during a TDMA burst, and ramp-down transition, into a single control signal, and by eliminating feedback control (which also eliminates errors in the feedback control of output power due to the use of detecting diodes). Output noise from the variable output switch-mode voltage converter stage is filtered using the linear regulator stage that accomplishes burst control, further increasing circuit efficiency. Energy efficiency during ramp-up to the desired output power, during the burst at all output power levels, and during rampdown from the transmitted power, is maximized. Reasonable expected efficiencies for the switch-mode converter stage and the linear regulator stage are 90% and 80%, respectively. A high-efficiency switch-mode amplifier may have an efficiency on the order of 80%, enabling an overall efficiency of greater than 50% to be achieved, comparing very favorably with current efficiencies of about 10%.

BRIEF DESCRIPTION OF THE DRAWING

The present invention may be further understood from the following description in conjunction with the appended drawing. In the drawing.

DETAILED DESCRIPTION OF THE PREFERRED EMBODIMENTS

Figure 3:
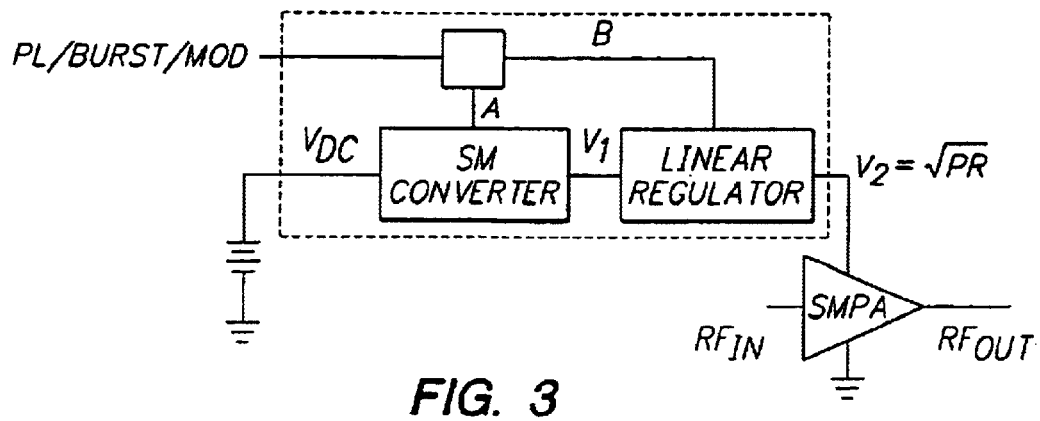
FIG. 3 is a block diagram of a power amplifier in accordance with an exemplary embodiment of the present invention.

Referring now to FIG. 3, a block diagram is shown of a power amplifier in accordance with an exemplary embodiment of the present invention. A switchmode (or saturated) nonlinear amplifier has applied to it a voltage produced by a power control stage. In an exemplary embodiment, the voltage V applied to the nonlinear amplifier is controlled substantially in accordance with the equation $$V=\sqrt{PR}$$

where P is the desired power output level of the amplifier and R is the resistance of the amplifier. In the case of a switch-mode or saturated amplifier, the resistance R may be regarded as constant. The power control stage receives a DC input voltage, e.g., from a battery, and receives a power level control signal and outputs a voltage in accordance with the foregoing equation.

Figure 1:
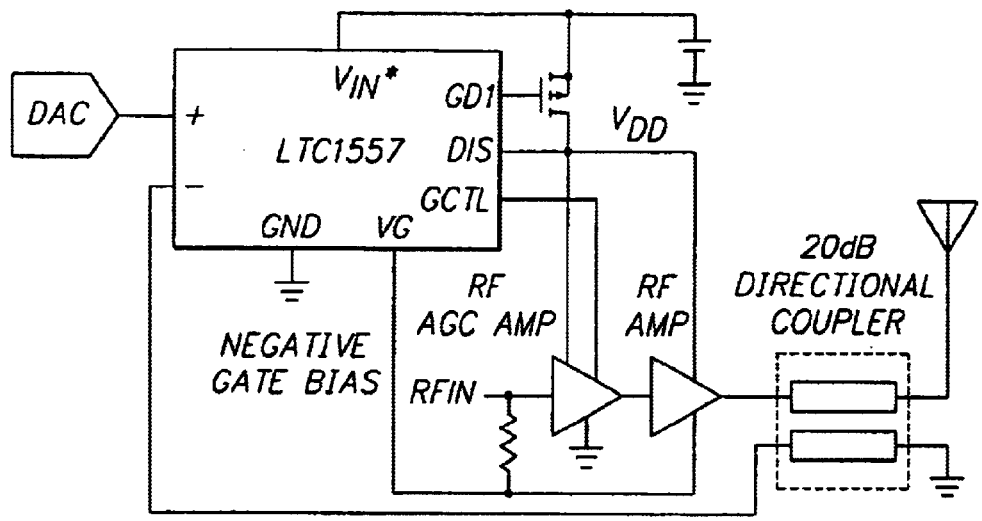
FIG. 1 is a block diagram of a known power amplifier with output power controlled by varying the power supply voltage.
Figure 2:
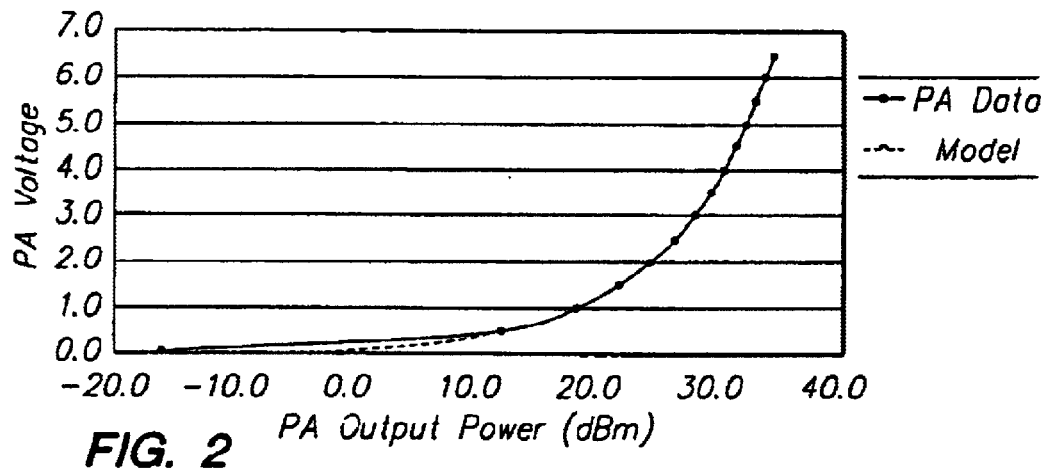
FIG. 2 is a plot comparing saturated Class AB power amplifier output power versus operating voltage with the mathematical model $V=\sqrt{PR}$.

The efficacy of directly controlling output power of nonlinear amplifiers over a wide dynamic range by solely varying the operating voltage is demonstrated by FIG. 2, showing a plot comparing saturated Class AB power amplifier output power versus operating voltage with the mathematical model $V=\sqrt{PR}$.

Referring now to FIG. 3, a power control circuit in accordance with an exemplary embodiment of the invention is shown. A power control stage includes a switch-mode converter stage and a linear regulator stage connected in series. The switch-mode converter may be a Class D device, for example, or a switch-mode power supply (SMPS). The switch-mode converter efficiently steps down the DC voltage to a voltage that somewhat exceeds but that approximates the desired power-amplifier operating voltage level. That is, the switch-mode converter performs an efficient gross power level control. The switch-mode converter may or may not provide sufficiently fine control to define ramp portions of a desired power envelope.

The linear regulator performs a filtering function on the output of the switch-mode converter. That is, the linear regulator controls precise power-envelope modulation during a TDMA burst, for example. The linear regulator may or may not provide level control capabilities like those of the switch-mode converter.

Note that, depending on the speed of the switch-mode converter and the linear regulator, the power control stage may be used to perform power control and/or amplitude modulation. A control signal PL/BURST is input to a control block, which outputs appropriate analog or digital control signals for the switch-mode converter and the linear regulator. The control block may be realized as a ROM (read-only memory) and/or a DAC (digital to analog converter).

Figure 4:
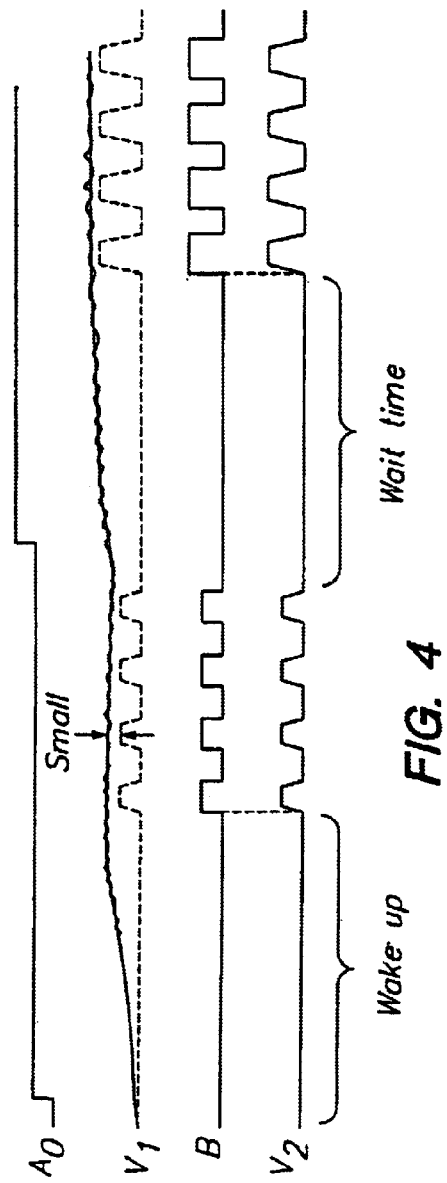
FIG. 4 is a waveform diagram illustrating operation of one embodiment of the invention.

Referring to FIG. 4, a waveform diagram is shown, illustrating operation of one embodiment of the invention. The waveforms A and B represent analog control signals applied to the switch-mode converter and to the linear regulator, respectively. The waveforms $V_1$ and $V_2$ represent the output voltages of the switch-mode converter and to the linear regulator, respectively. Assume that the switch-mode converter has a relatively large time constant, i.e., that it ramps relatively slowly. When the control signal A is set to a first non-zero power level, the voltage $V_1$ will then begin to ramp toward a commensurate voltage. Because of the switch-mode nature of the converter, the voltage $V_1$ may have a considerable amount of ripple. An amount of time required to reach that voltage defines the wakeup period. When that voltage is reached, the control signal B is raised and lowered to define a series of transmission bursts. When the control signal B is raised, the voltage $V_2$ ramps quickly up to a commensurate voltage, and when the control signal B is lowered, the voltage $V_2$ ramps quickly down. Following a series of bursts (in this example), the control signal A is raised in order to increase the RF power level of subsequent bursts. The control signal B remains low during a wait time. When the voltage $V_1$ has reached the specified level, the control signal B is then raised and lowered to define a further series of transmission bursts.

The voltage $V_2$ is shown in dotted lines superimposed on the voltage $V_1$. Note that the voltage $V_2$ is less than the voltage $V_1$ by a small amount, greater than the negative peak ripple on the voltage $V_1$. This small difference between the input voltage of the linear regulator $V_1$ and the output voltage of the linear regulator $V_2$ makes overall high-efficiency operation possible.

Figure 5:
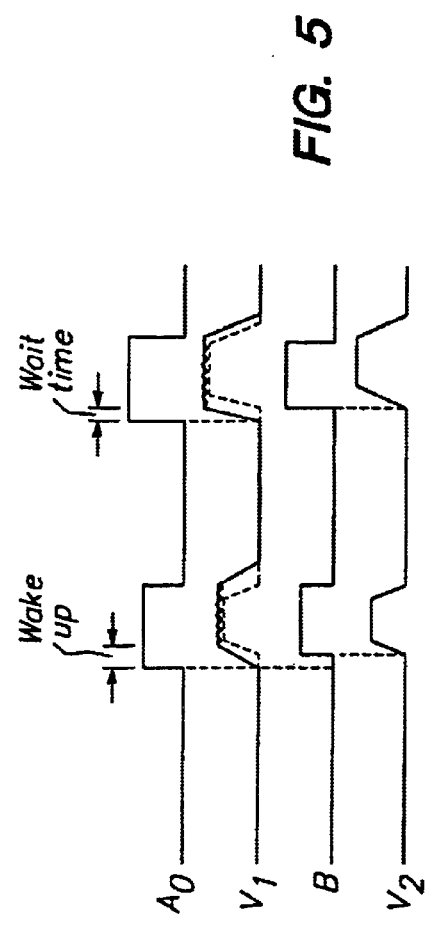
FIG. 5 is a waveform diagram illustrating operation of another embodiment of the invention.

Referring to FIG. 5, in accordance with a different embodiment of the invention, the switch-mode converter is assumed to have a relatively short time constant; i.e., it ramps relatively quickly. Hence, when the control signal A is raised, the voltage $V_1$ ramps quickly to the commensurate voltage. The control signal B is then raised, and the voltage $V_2$ is ramped. The time difference between when the control signal A is raised on the control signal B is raised defines the wake up time, which may be very short, maximizing sleep time and power savings. The control signal B is then lowered at the conclusion of the transmission burst, after which the control signal A is lowered. Following the example of FIG. 4, in FIG. 5, when the control signal A is next raised, it defines a higher power level. Again, the voltage $V_2$ is superimposed in dotted lines on the voltage $V_1$.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A variable output RF power amplifier for amplifying an RF input signal to produce an RF output signal, comprising:
    voltage regulator circuitry for producing a specified voltage within a range of voltages in accordance with at least one control signal, produced independently of the RF input signal, for performing at least one of level control and burst control; and
    a power amplifier including a final amplification stage having the specified voltage as a supply voltage and having a drive signal causing the final amplification stage to be driven repeatedly between two states, a hard-on state and a hard-off state, without operating the amplifier in a linear operating region for an appreciable percentage of time.

2. The apparatus of claim 1, wherein the voltage regulator means comprises a first switch-mode converter stage and a second linear regulator stage.

3. The apparatus of claim 2, wherein the switch-mode converter stage provides coarse level control and the linear regulator stage provides fine ramp control.

4. The apparatus of claim 3, wherein the power amplifier is hard-limited.

5. The apparatus of claim 4, wherein the power amplifier is a saturated amplifier selected from the group of Class A, Class AB and Class C amplifiers.

6. The apparatus of claim 3, wherein the power amplifier is a switch-mode amplifier.

7. The apparatus of claim 2, wherein the switch-mode converter stage provides level control and ramp control.

8. The apparatus of claim 2, wherein the linear regulator stage provides ramp control and level control.

9. The apparatus of claim 2, further comprising means for receiving said at least one control signal and in response thereto producing a first control signal for the switch-mode converter stage and a second control signal for the linear regulator stage.

10. A method of controlling a power level of a power amplifier for amplifying an RF input signal to produce an RF output signal, comprising:
    generating a specified voltage in accordance with at least one control signal, produced independently of the RF input signal, for performing at least one of level control and burst control;
    applying the specified voltage to a power amplifier as a supply voltage of a final amplification stage of the power amplifier; and
    repeatedly driving the final amplification stage between two states, a hard-on state and a hard-off state, without operating the amplifier in a linear operating region for an appreciable percentage of time.

11. The apparatus of claim 1, wherein the at least one control signal is for performing both level control and burst control.

12. The method of claim 10, wherein the at least one control signal is for performing both level control and burst control.

13. The apparatus of claim 1, wherein the power amplifier is controlled without continuous or frequent feedback adjustment of the RF output signal.

14. The method of claim 10, wherein the amplifier is controlled without continuous or frequent feedback adjustment of the RF output signal.

* * * * *